United States Patent [19]

Nitayama

[11] Patent Number: 4,784,969
[45] Date of Patent: Nov. 15, 1988

[54] METHOD OF MANUFACTURING A SEMICONDUCTOR MEMORY DEVICE

[75] Inventor: Akihiro Nitayama, Kawasaki, Japan

[73] Assignee: Kabushiki Kaisha Toshiba, Kawasaki, Japan

[21] Appl. No.: 43,444

[22] Filed: Apr. 28, 1987

[30] Foreign Application Priority Data

May 2, 1986 [JP] Japan .................. 61-102456

[51] Int. Cl.[4] .................. H01L 21/385; H01L 21/425; H01L 29/94
[52] U.S. Cl. ..................... 437/41; 437/47; 437/52
[58] Field of Search .............. 437/40, 47, 48, 49, 437/52, 67, 78, 41; 357/23.6

[56] References Cited

U.S. PATENT DOCUMENTS 4,658,283 4/1987 Koyama .................. 357/23.6

FOREIGN PATENT DOCUMENTS 0149799 7/1985 European Pat. Off. .......... 357/23.6
0201706 11/1986 European Pat. Off. .
3243125 5/1984 Fed. Rep. of Germany .
51-130178 12/1976 Japan ...................... 357/23.6
0175448 9/1985 Japan ...................... 357/23.6

OTHER PUBLICATIONS

'85 IEDM Digest of Technical Papers, "Buried Storage Electrode (BSE) Cell for Megabit DRAMS", p. 710; M. Sakamoto et al.; Dec. 1985.
IE[3] Electron Device Letters, "A MOS Transistor with Self-Aligned Polysilicon Source-Drain", vol. EDL-7, No. 5, p. 314; T-Y, Huang et al.; May, 1986.

Primary Examiner—Olik Chaudhuri
Attorney, Agent, or Firm—Oblon, Fisher, Spivak, McClelland & Maier

[57] ABSTRACT

A method of manufacturing a semiconductor memory apparatus comprising a memory cell structure consisting of a transistor and capacitor. The method comprises the steps of forming a groove in the capacitor-forming region of a semiconductor substrate, forming a capacitor insulating film on the surface of the semiconductor substrate, including the inner surface of the groove, providing first and second contact holes in the capacitor insulating film, forming a first conductive film over the entire surface of thus produced structure, patterning the first conductive material, thereby providing a capacitor electrode covering the inner surface of the groove and first contact hole, and an interconnection electrode covering the second contact hole, forming a first interlayer insulating film over the surfaces of the capacitor electrode and interconnection electrode, forming a gate insulating film on that portion of the surface of the semiconductor substrate which lies between the capacitor electrode and interconnection electrode, forming a second conductive film over the entire surface of thus produced structure, and back-etching the second conductive film, to form a gate electrode on the gate insulating film which lies between the capacitor electrode and interconnection electrode.

9 Claims, 8 Drawing Sheets

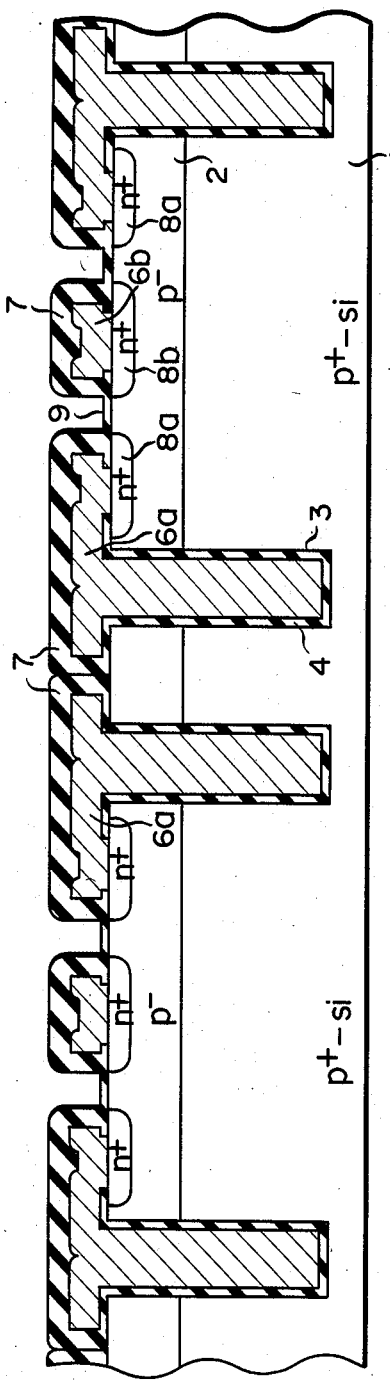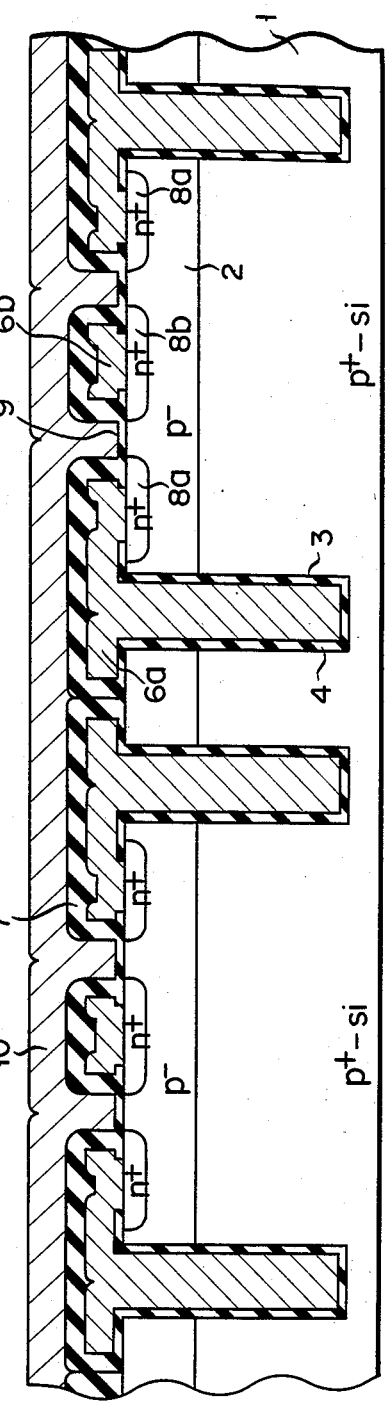

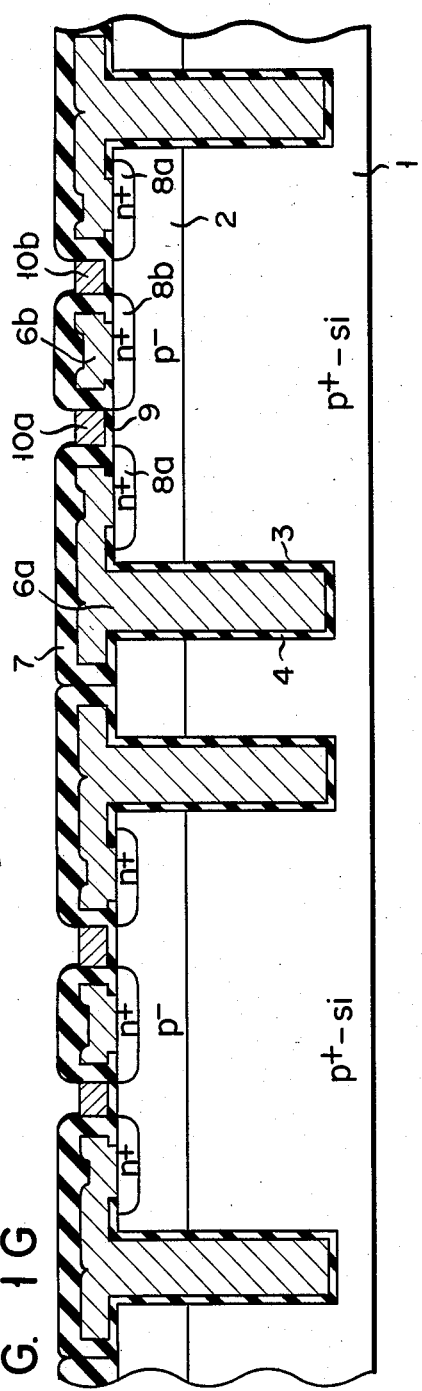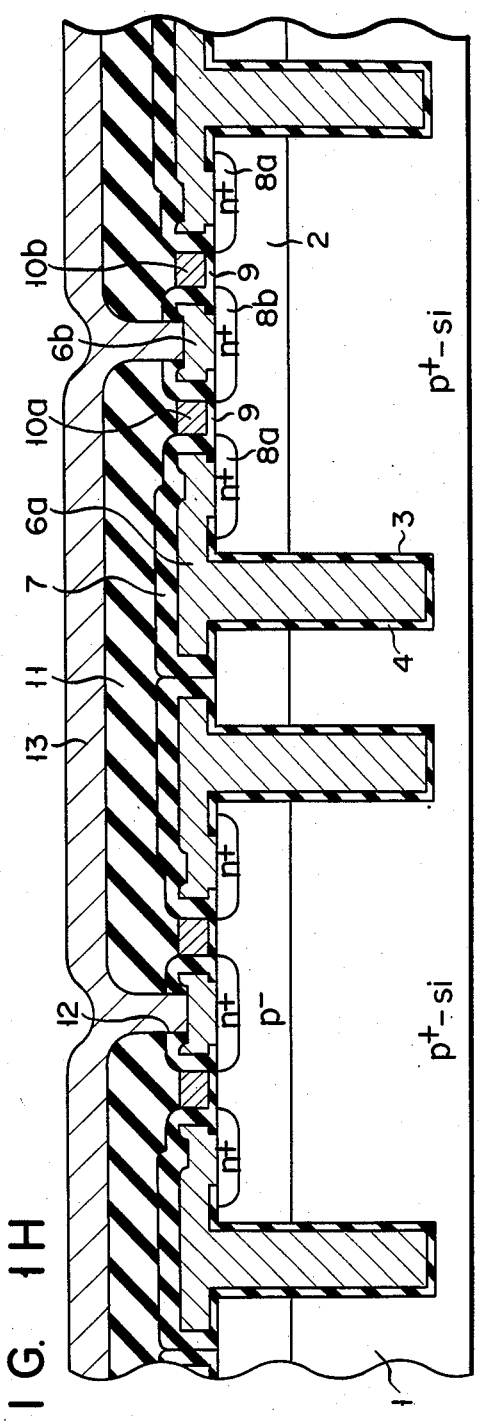

F I G. 3A
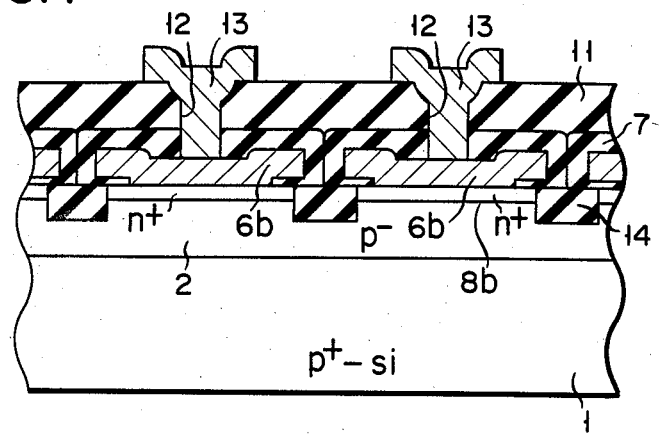
F I G. 3B
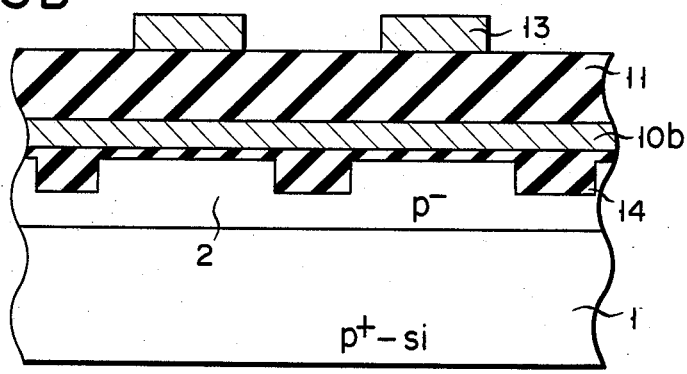
F I G. 3C
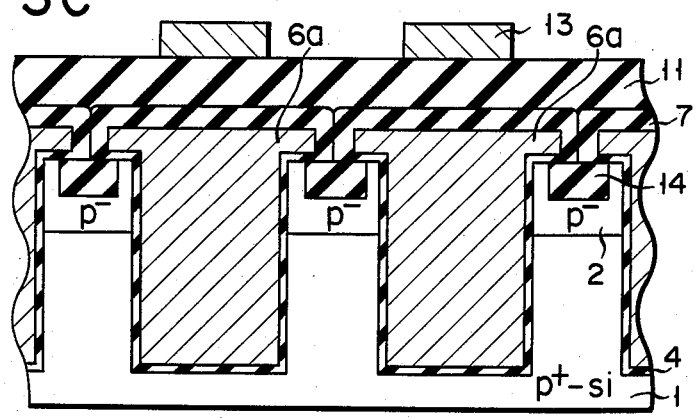

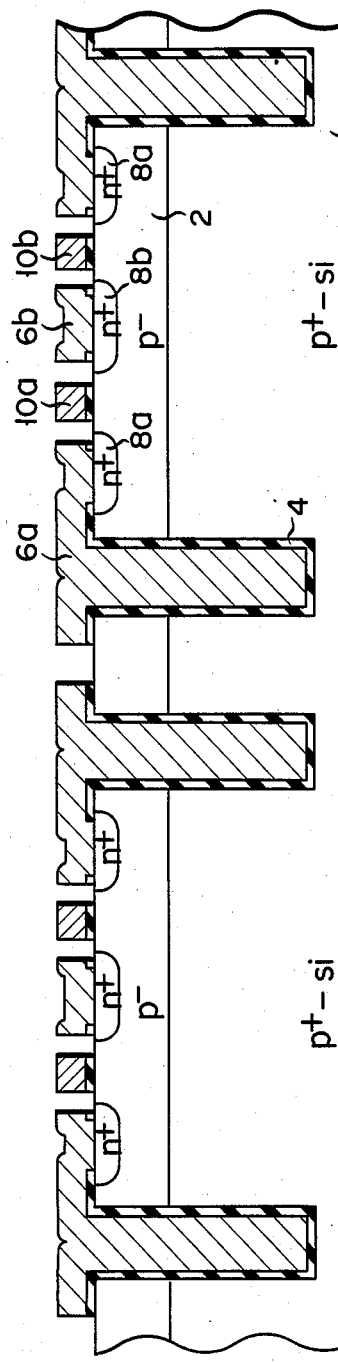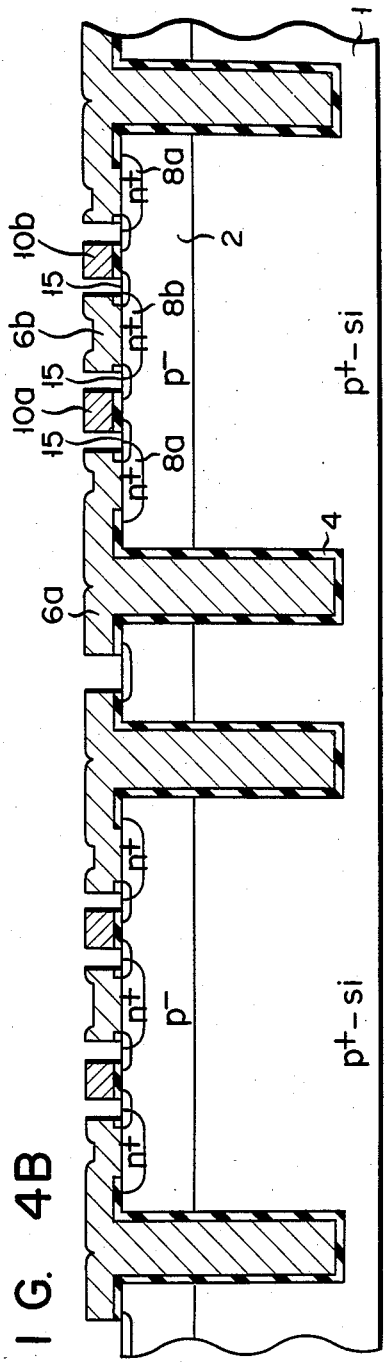

F I G. 5A
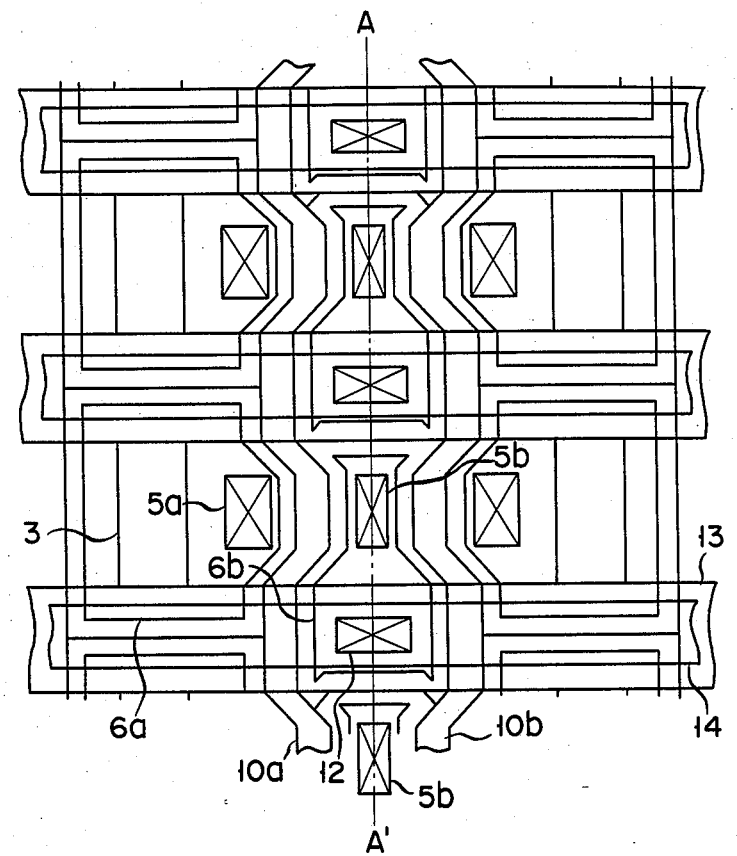
F I G. 5B
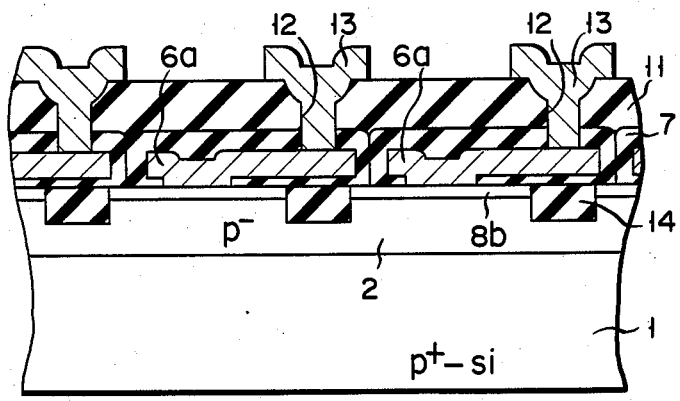

METHOD OF MANUFACTURING A SEMICONDUCTOR MEMORY DEVICE

BACKGROUND OF THE INVENTION

I. Field of the Invention

This invention relates to a method of manufacturing a semiconductor memory device which has a memory cell structure consisting of one transistor and one capacitor, and which stores data by way of electrical charges retained in the capacitor.

II. Description of the Prior Art

The memory cell of a dynamic RAM (dRAM) generally comprises an MOS capacitor which retains data in the form of an electrical charge, and a switching MOS transistor which exchanges the charge with an external circuit. As a dRAM increases in its memory capacity, each memory cell has to be progressively reduced in area. However, since the level of a signal for the reading of data is determined by the amount of charge stored in the MOS capacitor, its effective area cannot be reduced significantly. Up until the present time, therefore, a large number of proposals have been put forward which are designed to form a groove in the semiconductor substrate and provide a capacitor therein in three-dimensional form, in order to reduce the area of a capacitor provided on a chip and, while preserve a large effective area of the capacitor.

From the point of view of the fabricating technique, however, it is difficult to form a fine deep groove in a substrate. An MOS transistor constituting another structural element of a memory cell has to be miniaturized to permit the high integration of the subject semiconductor memory device. However, attempts to unduly shorten the gate length, to aid in the miniaturization of the subject device, incur the drawback in that the reliability of the device will be reduced because of, for example, the hot carrier effect.

Furthermore, demand for the high integration of a dRAM and the miniaturization of semiconductor elements has given rise to the under-mentioned difficulties. The structural elements such as a transistor and capacitor decrease in length, but not in thickness. Consequently, the aspect ratio of the respective layers increases. When, for example, a contact hole is formed by photolithography, the standing wave effect occurring in the stepped portion reduces the dimensional precision and gives rise to etching residues. When an interconnection layer is formed, disconnection and other difficulties arise at the time of deposition.

As has been described above, the high integration of a dRAM and the miniaturization of the elements involved are accompanied with various difficulties. The most important of the above-mentioned problems which most urgently require resolution are the elimination of the alignment margin between the capacitor and transistor as well as that between the bit line contact hole and transistor, and the achieving of a substrate having perfect flatness.

SUMMARY OF THE INVENTION

This invention has been developed in view of the above-mentioned object, and is intended to provide a method of manufacturing a semiconductor memory device in which the memory cell area can be reduced to a far greater extent than has been possible in the past; and the structure having the gate electrode can be made sufficiently flat, thereby facilitating the forming of wiring, and which comprises the steps of:

forming a groove in that portion of a semiconductor substrate where a capacitor is to be formed;

forming a capacitor-insulating film on the surface of the semiconductor substrate, including the inner surface of the groove;

providing first and second contact holes in the capacitor-insulating film;

forming a first conductive film over the entire surface of the structure produced up to this point;

patterning the first conductive film, to provide a capacitor electrode covering the groove and first contact hole, and forming an interconnection electrode covering the second contact hole;

forming a first interlayer insulating film on the surfaces of a capacitor electrode and interconnection electrode;

forming a gate insulating film on that portion of the substrate which lies between the capacitor electrode and interconnection electrode;

applying a second conductive film over the entire surface of the structure produced up to this point; and back-etching the second conductive film, thereby forming a gate electrode on said gate insulating film lying between the capacitor electrode and interconnection electrode.

An impurity-doped polycrystalline film can be used as a first conductive film. In this case, source and drain regions can be formed by the diffusion of an impurity from the first conductive film to the substrate, through the first and second contact holes, during the thermal oxidation applied for the formation of, for example, the first interlayer insulating film.

Alternatively, after forming the gate electrode and removing the first interlayer insulating film, the source and drain region can be provided by ion implantation with the gate electrode, capacitor electrode and interconnection electrode used as masks.

When the first interlayer insulating film is formed on the gate and capacitor electrodes by the thermal oxidation of the structure produced up to this point, a thin oxide film is formed also on the surface of the substrate, as well as on the electrodes. In this case, when ion implantation is performed into the substrate through the thin oxide film, formed on the substrate it is possible to control the threshold value of the MOS transistor or to suppress punchthrough.

The gate insulation film can usually be formed by removing a thin oxide film laid on the substrate, and then carrying out thermal oxidation. Etch-back of the second conductive material can be effected by use of an anisotropic etching method; for example, reactive ion etching.

After the deposition of the gate electrode, a second interlayer insulating film is formed over the entire surface of the structure produced up to this point. A third contact hold is provided in that portion of the second interlayer insulating film which is set on the interconnection electrode. A bit line can be formed through the third contact hole in contact with the interconnection electrode. In this case, contact between the bit line and interconnection electrode can be realized with some margin by extending the interconnection electrode up to a position above the isolation region, providing a third contact hole above the isolation region, and preventing the second contact hole from overlapping the third contact hole.

As is mentioned above, according to the present invention, the capacitor electrode and the interconnection electrode to be connected to the bit line substrate can be provided at the same time, and the gate electrode of an MOS transistor is formed in self-alignment between the capacitor electrode and interconnection electrode. Consequently it is not necessary to consider a margin for the alignment of the MOS transistor and capacitor. Further, the interconnection electrode is formed in advance, to effect connection between the bit line and substrate. Therefore, a sufficient margin is allowed for the alignment of the bit line, the MOS transistor, and capacitor. Consequently, the present invention can reduce the area of a memory cell to a far greater extent than that of the conventional memory cell. Moreover, the present invention eliminates the lithographic process formerly required for the formation of a gate electrode, thereby suppressing a drop in the dimensional precision which has hitherto occurred, due to the standing-wave effect, arising at the time of lithography. Further advantages of the present invention are that after the formation of the gate electrode, the surface of the subject semiconductor memory apparatus made flat because the capacitor electrode, interconnection electrode, and gate electrode are laid flat, thereby facilitating the subsequent wiring process and ensuring the highly reliable fine machining.

BRIEF DESCRIPTION OF THE DRAWINGS

FIGS. 1A to 1H are the sectional views illustrating the sequential steps of manufacturing a dRAM apparatus according to a first embodiment of the present invention;

FIGS. 3A, 3B, and 3C are respectively sectional views of lines A-A', B-B', and C-C' of FIG. 2;

FIGS. 4A and 4B are sectional views illustrating some of the sequential steps of manufacturing a dRAM apparatus according to a second embodiment of the invention; and FIGS. 5A and 5B are respectively a plan view and a sectional view on line A-A' of a dRAM apparatus according to a second embodiment of the invention.

DETAILED DESCRIPTION OF THE PREFERRED EMBODIMENTS

Figure 1A:
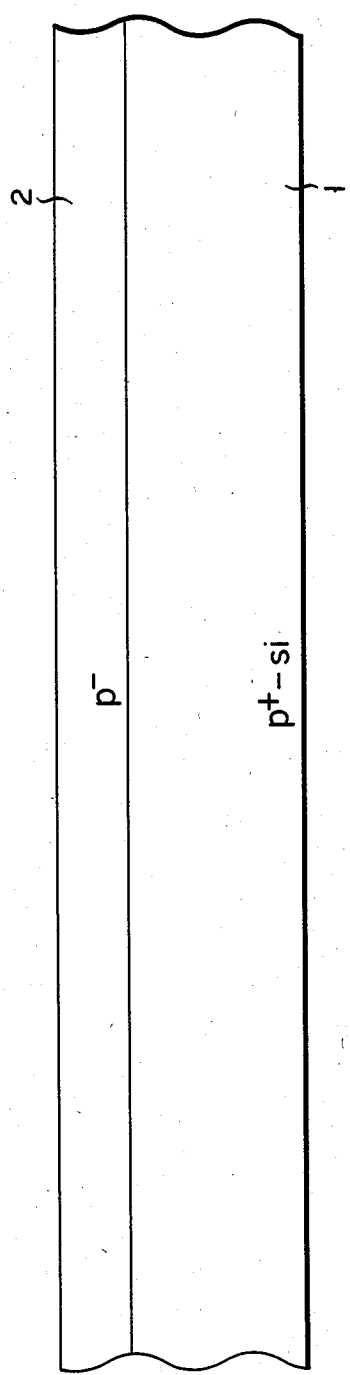
Figure 1B:
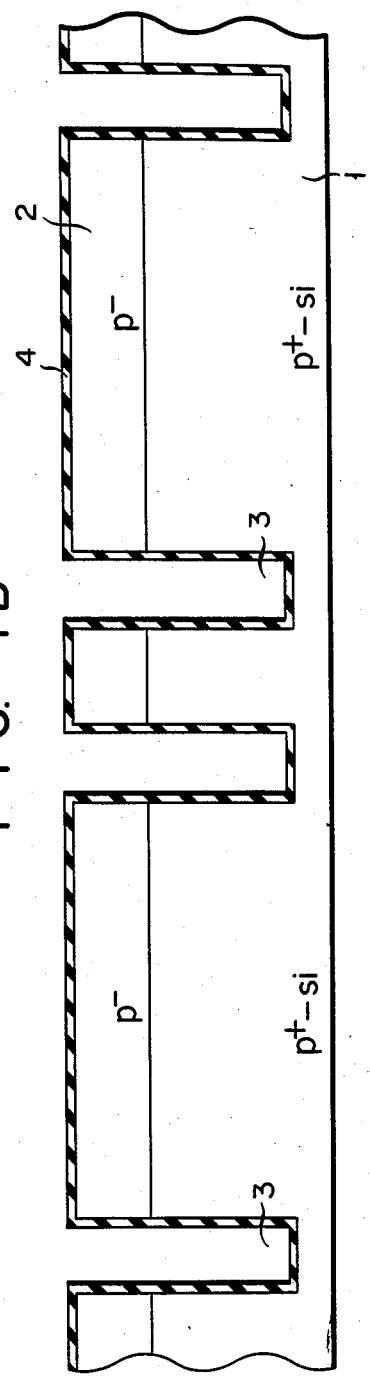
Figure 1C:
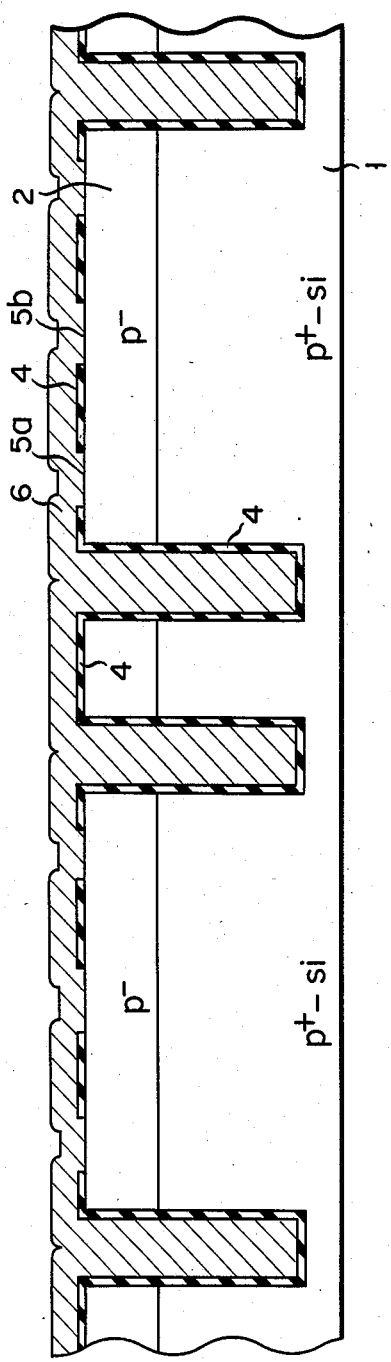

A dRAM apparatus according to a first embodiment of the present invention will now be described, with reference to the appended drawings.

As is shown in FIG. 1, p-type layer 2 (thickness: 3 $\mu$m) of low impurity concentration ($1 \times 10^{16}$ cm$^{-3}$) is epitaxially grown on p-type Si substrate 1 of high impurity concentration ($1 \times 10^{18}$ cm$^{-3}$). As is shown in FIG. 1B, substantially square grooves 3 (depth: 5 $\mu$m) having a side of several microns is formed in a capacitor region. Capacitor insulation layer 4 is formed, by means of thermal oxidation, with a thickness of (100 Å) over the entire surface of wafer 2, including the inner surfaces of square grooves 3. Groove 3 is formed with a sufficient depth by means of ion etching, so that the bottom is under an interface between p-type layer 2 and substrate 1. As can be seen in FIG. 1C, two contact holes, 5a, 5b are formed in capacitor insulation layer 4 by use of the customary lithographic process. Later, polycrystalline layer 6, acting as first electrode layer, is formed over the entire surface of substrate 1. Polycrystalline silicon layer 6 is formed of phosphorus-doped polycrystalline silicon layer, prepared by use of the CVD process, with a thickness of, for example, about 4000 Å. Then, as can be seen in FIG. 1C, polycrystalline silicon layer 6 is fully embedded in grooves 3, thus rendering the entire surface substantially flat. This object can be fully attained by selecting the thickness of polycrystalline silicon layer 6 in accordance with the width of groove 3.

Figure 1D:
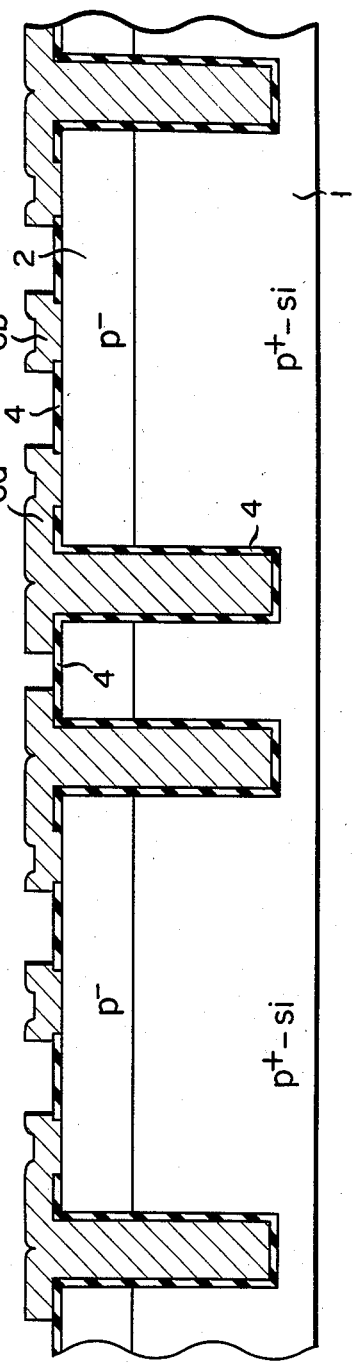

Later, as is shown in FIG. 1D, polycrystalline silicon layer 6 is patterned by the customary lithographic and etching processes, to provide interconnection electrode 6b for connecting capacitor electrode 6a and bit line to substrate 1. Then, as is shown in FIG. 1E, first interlayer insulation film 7 is formed, by wet oxidation, on the surfaces of capacitor electrode 6a and interconnection electrode 6b. First interlayer insulating film 7 is formed with a thickness of about 2000 Å. An interval between the top portions of the capacitor electrodes 6a of two adjacent memory cells can be completely filled with insulating film 7, by properly defining the thickness of film 7. During the aforementioned wet oxidation, phosphorus contained in capacitor electrode 6a and interconnection electrode 6b is diffused into substrate 1, thereby providing n-type regions 8a, 8b respectively constituting the source and drain regions of the MOS transistor. During the abovementioned wet oxidation, an oxide layer is formed on the surface of the substrate, with a thickness of about 400 Å. This oxide layer is thinner than that formed on capacitor electrode 6a and interconnection electrode 6b, during the above wet-oxidation process. If necessary, therefore, ion implantation is carried out through said oxide layer, in order to control the threshold level of the MOS transistor or to suppress punchthrough. Later, the oxide layer formed on the surface is removed, and thermal oxidation is performed to provide gate insulation layer 9 with a thickness of, for example, 200 Å.

Later, as can be seen in FIG. 1F, polycrystalline silicon layer 10 is formed, as a second electrode layer, over the entire surface of the substrate fabricated up to this point by the CVD process, with a thickness of, for example, 5000 Å. Then, polycrystalline silicon layer 10 is etched over its entire surface, in other words, the so-called etch-back is performed, except for that portion of layer 10 which lies between capacitor electrode 6a and interconnection electrode 6b, thereby providing MOS transistor gate electrodes 10a, 10b. In this state, the surface of substrate 1 is completely covered with interconnection electrode 6b, and gate electrode 10a, 10b, thus providing a completely flat plane. Lastly, as is shown in FIG. 1H, second interlayer insulating film 11 is prepared from a CVD oxide layer or a PSG layer. An aluminum bit line is then formed over the entire surface of the substrate produced up to this point, with contact hole 12 provided in those portions of interlayer insulating film 11 which lie above interconnection electrode 6b.

Figure 2:
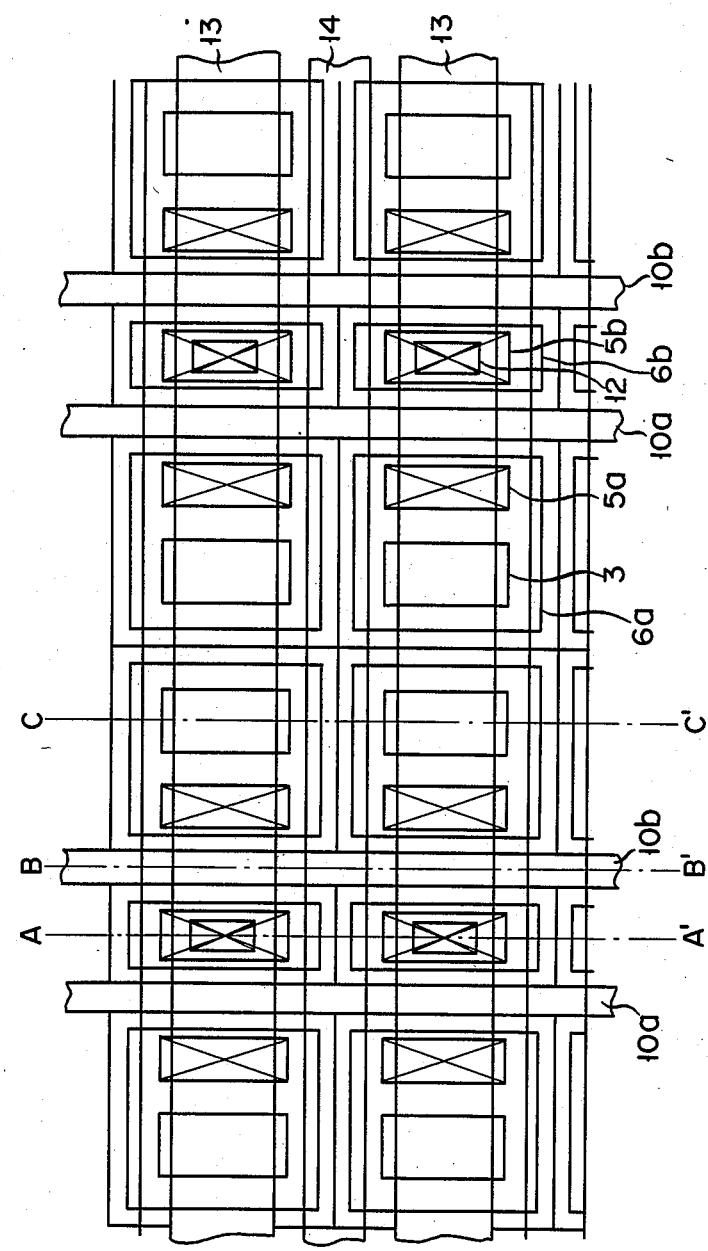
FIG. 2 is a plan view of a memory cell array obtained by the manufacturing method according to this first embodiment.

FIG. 2 is a plan view of an open bit line type memory cell array embodying the present invention. The sectional views of the sequential steps shown in FIG. 1A to FIG. 1H correspond to the sections along bit line 13 of FIG. 2. Sectional views A-A', B-B', and C-C' of FIG. 2 respectively correspond to FIGS. 3A, 3B, and 3C. Element-isolating insulation layer 14 is embedded between the adjacent bit lines, namely, in the longitudinal direction of FIG. 2. As can be seen from FIGS. 1A to 1H, however, no element-isolating layer is provided in the direction of the bit line. With the conventional common dRAM cell, memory nodes are provided on the substrate side. A capacitor electrode formed on the memory nodes is used in common by all memory cells, as the so-called cell plate. In the embodiment of this invention, however, capacitor electrode 6a is used as an independent memory node for each memory cell.

As has been mentioned above, the present invention offers the advantages that capacitor electrode 6a and the gate electrode 10a, 10b of an MOS transistor are provided in self-aligned form, thereby eliminating the need for a lithographic process in the formation of a gate electrode, and thus, decreasing the number of manufacturing steps required for the formation of the memory device; the capacitor electrode and gate electrode can be set close to each other, with no aligning process being required; and interconnection electrode 6b for connecting bit line 13 to the substrate can be formed at the same time as capacitor electrode 6a. Therefore, if bit line contact hole 12 is positioned above interconnection electrode 6b, it will be sufficient, thus offerng a sufficient alignment margin for the bit line contact hole. Since, moreover, interconnection electrode 6b is provided, bit line contact hole 12 can be made shallower than was required in the past, thus facilitating fine patterning. Furthermore, since the surface of the structure, after the formation of capacitor electrode 6a, interconnection electrode 6b, and gate electrodes 10a, 10b, can be made extremely flat, the lithographic process applied in the subsequent wiring-forming step can be performed with high precision. Therefore, a dRAM apparatus can be manufactured incorporating extreme miniaturization of elements and high integration of components.

In the foregoing embodiment, the source and drain region of a MOS transistor were formed only by means of solid phase diffusion, with the capacitor electrode and relay electrode as diffusion sources. However, this embodiment is accompanied with the drawback that the diffusion region cannot be formed under fully controlled conditions. If diffusion fails to be performed sufficiently in the crosswise direction, the resultant MOS transistor tends to have an off-set gate structure.

Another embodiment will now be described which improves the above-mentioned drawback. FIGS. 4A and 4B are the sectional views of the main steps of manufacturing a dRAM apparatus according to a second embodiment of the present invention. The steps up to that of forming the gate electrode are the same on those of the preceding embodiment. Steps of FIGS. 1A to 1G complete the formation of the gate electrode. Later, insulation layer 7 formed on capacitor electrode 6a and interconnection electrode 6b are etched to provide the state of FIG. 4A. At this time, an impurity is ion implanted, thereby forming, as shown in FIG. 4B, n-type regions 15 functioning as part of a source or drain region are formed in those portions of the substrate which are interposed between two adjacent electrodes of gate electrodes 10a, 10b, capacitor electrode 6a and interconnection electrodes 6b. The subsequent steps are the same as those taken in the first embodiment. According to the second embodiment, it is possible to obtain an impurity profile with a higher precision than in the case where source and drain regions are formed simply by the diffusion of an impurity from the polycrystalline silicon layer.

A dRAM cell array according to a third embodiment of the invention will now be described, with reference to FIG. 5A, which shows a plan view, and FIG. 5B, which shows a sectional view, taken on line A-A', of FIG. 5A. Throughout the foregoing embodiments, contact hole 5b for connecting interconnection electrode 6b to the substrate and contact hole 12 provided on interconnection electrode 6b are made to occupy the same position. Throughout the foregoing embodiments however, it is necessary to enlarge interconnection electrode 6b to same extent in order to allow for some alignment margin. This has impeded the higher integration of the subject apparatus. In the third embodiment of FIGS. 5A and 5B, interconnection electrode 6b is made to extend over the element isolation region, thereby providing contact hole 12, and forming bit line 13 on the element isolating region. As seen from FIG. 5A, it is possible to fully widen interconnection electrode 6b on the element isolation region. Therefore, the third embodiment offers the advantage that even when the memory cell is considerably reduced in the cross wise measurement, the contact of the bit line can be effected with a sufficient margin.

This invention is not limited to the aforementioned embodiment. In one of the embodiments, separate contact holes 5a, 5b are separately provided in the capacitor insulating film for the contact of the capacitor electrode and interconnection electrode with the substrate. However, said contact holes 5a, 5b need not be separately formed. In other words, it is possible to retain only those portions of capacitor insulating film 4 which are required to function as such, with the remaining portions eliminated, thereby enabling the broader surface area of the substrate to the exposed.

The foregoing embodiments represent a memory cell array of the open bit line type. However, the present invention is likewise applicable to a memory cell array of the folded bit line type.

What is claimed is:

1. A method of manufacturing a semiconductor memory device having a capacitor and transistor, which comprises the steps of:
   providing a groove in a capacitor-forming region of a semiconductor substrate;
   forming a capacitor-insulating film on the semiconductor substrate, including the inner surface of the groove;
   providing first and second holes in that portion of the capacitor-insulating film which is formed on the surface of the substrate;
   forming a first conductive film over the entire surface of thus produced structure;
   patterning said first conductive film, to form a capacitor electrode covering the inner surface of the groove and first contact hole, and an interconnection electrode covering the second contact hole;
   forming a first interlayer insulating film on the surfaces of the capacitor electrode and interconnection electrode;
   forming a gate insulating film on that portion of the substrate which lies between the capacitor electrode and interconnection electrode;
   forming a second conductive film over the entire surface of thus produced structure; and
   back-etching the second conductive film, to form a gate electrode on the gate-insulating film which lies between the capacitor electrode and interconnection electrode.

2. The method according to claim 1, wherein the first conductive film is prepared from impurity-doped polycrystalline silicon film; and the impurity is diffused from the capacitor electrode and interconnection electrode to the substrate, through the first and second contact holes, thereby to form source and drain regions.

3. The method according to claim 1, wherein the interlayer insulating film is removed after the formation of the gate electrode; and ion implantation is performed with the gate electrode, capacitor electrode, and interconnection electrode used as masks, thereby forming source and drain regions.

4. The method according to claim 1, wherein the interlayer insulating film is prepared by the thermal oxidation of the structure obtained up to this point, and ions are implanted into the substrate, through the insulation film formed on the substrate.

5. The method according to claim 4, wherein the gate insulation film is formed by a second thermal oxidation after the removal of the insulation film formed by said first thermal oxidation on the substrate.

6. The method according to claim 1, wherein the back-etching step is performed by use of anisotropic etching.

7. The method according to claim 1, wherein, after the formation of the gate electrode, a second interlayer insulating film is formed over the entire surface of the structure obtained up to this point; a third contact hole is provided in that portion of the second interlayer insulating film which is mounted on the interconnection electrode; and a bit line is formed in contact with the interconnection electrode, through the third contact hole.

8. The method according to claim 7, wherein the second and third contact holes do not overlap each other.

9. A method of manufacturing a semiconductor memory device having a capacitor and transistor, which comprises the steps of:
providing a groove in a capacitor-forming region of a semiconductor substrate;
forming a capacitor-insulating film on the entire surface of the semiconductor substrate, including the inner surface of said groove;
selectively etching that portion of said capacitor-insulating film which is formed on the surface of said substrate, to form first and second contact holes;
depositing first conductive material on the insulating film having the contact holes to form a first conductive film;
selectively etching said first conductive film, to form a capacitor electrode buried in the groove and first contact hole, and an interconnection electrode buried in the second contact hole;
forming an interlayer insulating film on the surfaces of the capacitor electrode and interconnection electrode;
forming a gate insulating film on that portion of the substrate which lies between the capacitor electrode and interconnection electrode;
forming a second conductive film over the entire surface of thus produced structure; and
back-etching the second conductive film, to leave as a gate electrode that portion of the second conductive film on the gate-insulating film which lies between the capacitor electrode and interconnection electrode.

* * * * *